US012736031B2

(12) United States Patent
Rakshit et al.

(10) Patent No.: US 12,736,031 B2
(45) Date of Patent: Sep. 15, 2026

(54) OPTIMIZING ENERGY PRODUCTION BY A WIND TURBINE HAVING SHADOW ENERGY GENERATOR

(71) Applicant: International Business Machines Corporation, Armonk, NY (US)

(72) Inventors: Sarbajit K. Rakshit, Kolkata (IN); Manikandan Padmanaban, Chennai (IN); Jagabondhu Hazra, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 18/491,897

(22) Filed: Oct. 23, 2023

(65) Prior Publication Data

US 2025/0129769 A1 Apr. 24, 2025

(51) Int. Cl.

*F03D 17/00* (2016.01)
*F03D 9/00* (2016.01)
*G06F 30/20* (2020.01)

(52) U.S. Cl.

CPC ........... *F03D 17/006* (2023.08); *F03D 9/007* (2013.01); *G06F 30/20* (2020.01); *F05B 2260/821* (2013.01)

(58) Field of Classification Search

CPC .......... H02S 10/12; F03D 9/007; F03D 13/25; F03D 9/12

See application file for complete search history.

(56) References Cited

U.S. PATENT DOCUMENTS 8,330,296 B2 * 12/2012 Ottman .................. F03D 13/25 307/72
9,261,075 B2 2/2016 Li et al.
(Continued)

FOREIGN PATENT DOCUMENTS

| | | |
|---|---|---|
| CN | 112632851 B | 5/2022 |
| EP | 2554840 A1 | 2/2013 |

OTHER PUBLICATIONS

Mamia et al.; Shadow analysis of wind turbines for dual use of land for combined wind and solar photovoltaic power generation; Dec. 5, 2015.*

(Continued)

*Primary Examiner* — Scott T Baderman
*Assistant Examiner* — Rokeya Shawali Alam
(74) *Attorney, Agent, or Firm* — Cantor Colburn LLP; Stephen Yoder

(57) ABSTRACT

Computer-implemented methods for optimizing energy production by a wind turbine having shadow energy generator are provided. Aspects include obtaining a geographic location of the wind turbine and a weather forecast for the geographic location. Aspects also include calculating an estimated wind energy production for each of a plurality of configurations of the wind turbine based on the weather forecast, calculating an estimated shadow energy generator energy production for each of the plurality of configurations of the wind turbine based on the weather forecast, and identifying one of the plurality of configurations of the wind turbines based on a combination of the estimated wind energy production and the estimated shadow energy generator energy production. Aspects further include reconfiguring the wind turbine into a first configurations, where the first configurations is identified as the configuration with a (Continued)

largest sum of estimated wind energy production and estimated shadow energy generator energy production.

18 Claims, 5 Drawing Sheets

(56) References Cited

U.S. PATENT DOCUMENTS

| | | | | |
|---|---|---|---|---|
| 9,599,299 | B2 | 3/2017 | Hoang | |
| 2010/0183443 | A1* | 7/2010 | Thorne | H02S 10/12 136/244 |
| 2011/0089698 | A1* | 4/2011 | Ahmadi | F03D 9/007 290/55 |
| 2013/0184884 | A1* | 7/2013 | More | F03D 9/12 290/44 |
| 2015/0145254 | A1* | 5/2015 | Rodionov | F03D 9/007 290/44 |
| 2017/0012464 | A1* | 1/2017 | Sant'Anselmo | F24S 25/10 |
| 2021/0404442 | A1 | 12/2021 | Skovdal et al. | |

OTHER PUBLICATIONS

NUSnews; Using the 'shadow-effect' to generate electricity; May 21, 2020.*

Anonymous, "Method and System for Dynamic Shape Change of a Robot to Harvest Power from a Shadow, "Nov. 2, 2021, An IP.com Prior Art Database Technical Disclosure, IP.com No. IPCOM000267538D.

Chavan, Datta S., et al. "Adjustable concentric towers to vary tower shadow effect on flicker in wind turbine." 2017 International Conference on Energy, Communication, Data Analytics and Soft Computing (ICECDS). IEEE, 2017, pp. 755-760.

Das, Amit K., et al. "Enhanced energy harvesting from shadow-effect: mechanism and a new device geometry." arXiv preprint arXiv:2009.03659 (2020): 7 pages.

Inforse "DIERET: Wind Energy" https://www.inforse.org/europe/dieret/Wind/wind.html (Retrieved Aug. 21, 2023), 23 pages.

Anonymous, "Micro turbine array usage in multiple applications," Mar. 28, 2011, An IP.com Prior Art Database Technical Disclosure, IP.com No. IPCOM000205353D.

Zhang, et al, "Energy harvesting from shadow-effect", Royal Society of Chemistry, Energy Environmental Science, 2020, 11 pages.

* cited by examiner

OPTIMIZING ENERGY PRODUCTION BY A WIND TURBINE HAVING SHADOW ENERGY GENERATOR

BACKGROUND

The present disclosure generally relates to wind turbines, and more specifically, to optimizing energy production by a wind turbine having a shadow energy generator.

Wind turbines are devices that convert the kinetic energy of the wind into mechanical energy and then into electrical energy. Wind turbines traditionally include a tall tower and a set of rotating blades, often resembling a propeller. Ideally, the tower is positioned at a location with consistent and strong winds, typically onshore or offshore areas where wind is more prevalent. When the wind blows, it causes the blades of the wind turbine to spin. The kinetic energy of the moving air is transferred to the blades, causing them to rotate and this mechanical energy is transferred from the spinning shaft to the generator. The generator then converts the mechanical energy from the spinning shaft into electrical energy.

In instances where the wind is not blowing, or not blowing with sufficient velocity, wind turbines are not able to produce energy.

SUMMARY

Embodiments of the present disclosure are directed to computer-implemented methods for optimizing energy production by a wind turbine having a shadow energy generator. According to an aspect, a computer-implemented method includes obtaining a geographic location of the wind turbine, obtaining a weather forecast for the geographic location, and calculating an estimated wind energy production for each of a plurality of configurations of the wind turbine based on the weather forecast. The method also includes calculating an estimated shadow energy generator energy production for each of the plurality of configurations of the wind turbine based on the weather forecast, identifying one of the plurality of configurations of the wind turbines based on a combination of the estimated wind energy production and the estimated shadow energy generator energy production, and reconfiguring the wind turbine into the one of the plurality of configurations. The one of the plurality of configurations of the wind turbines is identified as a configuration with a largest sum of the estimated wind energy production and the estimated shadow energy generator energy production.

Embodiments also include a wind turbine having a shadow energy generator. The wind turbine has a memory having computer readable instructions and a processing device for executing the computer readable instructions. The computer readable instructions controlling the processing device to perform operations that include obtaining a geographic location of the wind turbine, obtaining a weather forecast for the geographic location, and calculating an estimated wind energy production for each of a plurality of configurations of the wind turbine based on the weather forecast. The operations also include calculating an estimated shadow energy generator energy production for each of the plurality of configurations of the wind turbine based on the weather forecast, identifying one of the plurality of configurations of the wind turbines based on a combination of the estimated wind energy production and the estimated shadow energy generator energy production, and reconfiguring the wind turbine into the one of the plurality of configurations. The one of the plurality of configurations of the wind turbines is identified as a configuration with a largest sum of the estimated wind energy production and the estimated shadow energy generator energy production.

Embodiments also include a computer program product having a computer readable storage medium having program instructions embodied therewith. The program instructions executable by a processor to cause the processor to perform operations that include obtaining a geographic location of the wind turbine, obtaining a weather forecast for the geographic location, and calculating an estimated wind energy production for each of a plurality of configurations of the wind turbine based on the weather forecast. The operations also include calculating an estimated shadow energy generator energy production for each of the plurality of configurations of the wind turbine based on the weather forecast, identifying one of the plurality of configurations of the wind turbines based on a combination of the estimated wind energy production and the estimated shadow energy generator energy production, and reconfiguring the wind turbine into the one of the plurality of configurations. The one of the plurality of configurations of the wind turbines is identified as a configuration with a largest sum of the estimated wind energy production and the estimated shadow energy generator energy production.

Additional technical features and benefits are realized through the techniques of the present disclosure. Embodiments and aspects of the disclosure are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the present disclosure are apparent from the following detailed description taken in conjunction with the accompanying drawings in which:

DETAILED DESCRIPTION

Figure 1:
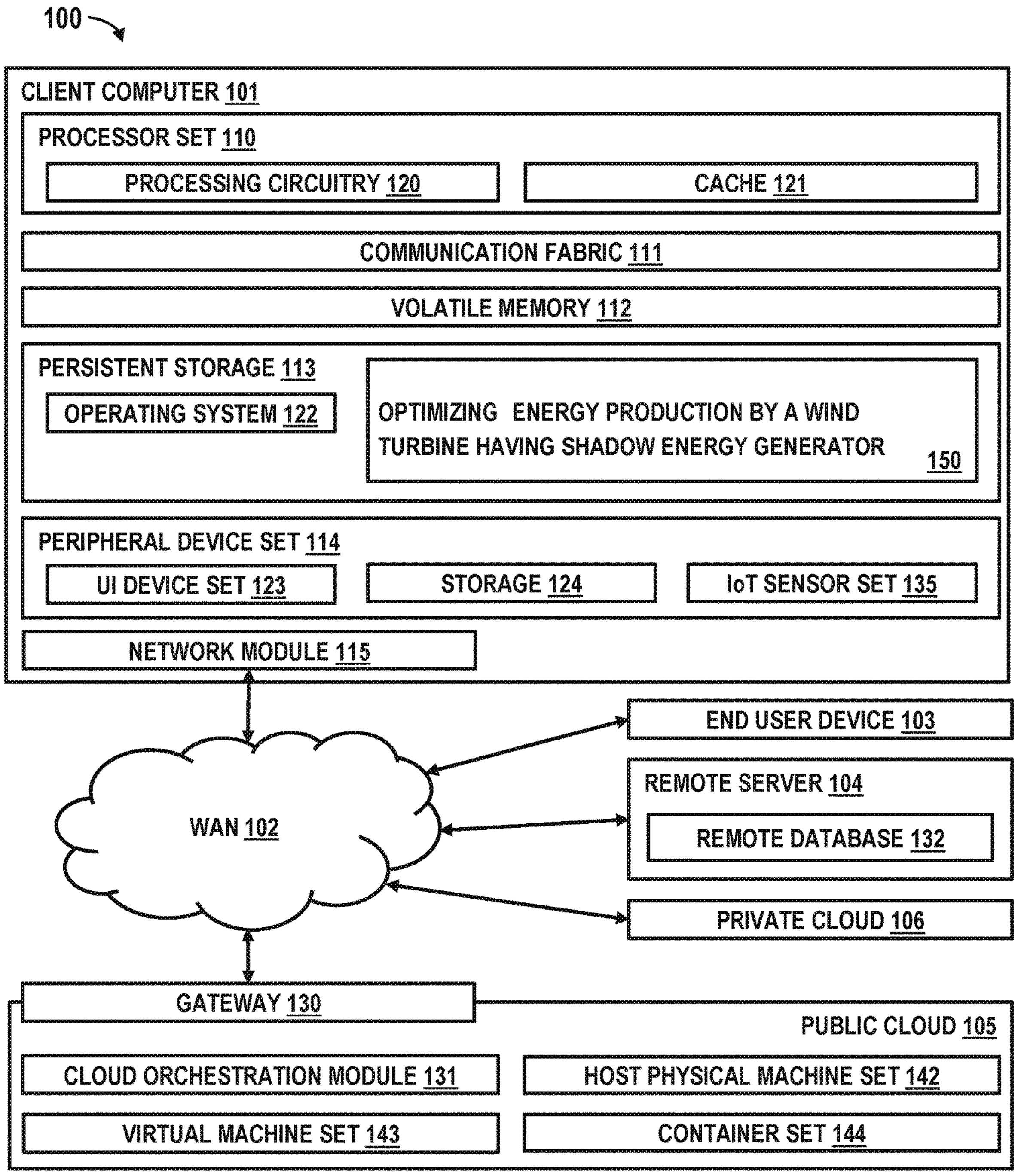
FIG. 1 depicts a block diagram of an example computer system for use in conjunction with one or more embodiments of the present disclosure.

As discussed above, wind turbines are devices that convert the kinetic energy of the wind into mechanical energy and then into electrical energy. However, when the wind is not blowing, or not blowing with sufficient velocity, wind turbines are not able to produce energy.

In exemplary embodiments, a wind turbine having a shadow energy generator is provided. A shadow energy generator is a device that is similar to a traditional photovoltaic cell, or solar cell, but that also includes a thin layer of gold, aluminum, tungsten, or copper that is disposed on a layer of silicon. The shadow energy generator is configured to generate electricity when a portion of the shadow energy generator is disposed in sunlight and another portion of the shadow energy generator is disposed in the shade. In exemplary embodiments, the wind turbine includes blades and a tower that may both be covered with shadow energy generator cells.

In exemplary embodiments, methods, systems, and computer program products for optimizing energy production by a wind turbine having a shadow energy generator are provided. The wind turbine is capable of being configured into a plurality of configurations that are characterized by a pitch of the blades of the wind turbine and an orientation of a nacelle of the wind turbine. In an exemplary embodiment, a weather forecast for the location of the wind turbine is obtained and used to calculate an estimated shadow energy generator energy production for each of the plurality of configurations and an estimated wind energy production for each of a plurality of configurations of the wind turbine. In exemplary embodiments, the configuration of the wind turbine is selected to maximize the total energy production of the wind turbine, where the total energy production is the sum of wind energy production and a shadow energy generator energy production. Once an optimal configuration is identified, the wind turbine is reconfigured into the optimal configuration to maximize the energy generated by the wind turbine.

Various aspects of the present disclosure are described by narrative text, flowcharts, block diagrams of computer systems, and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as optimizing energy production by a wind turbine having a shadow energy generator (block 150). In addition to block 150, computing environment 100 includes, for example, computer 101, wide area network (WAN) 102, end user device (EUD) 103, remote server 104, public Cloud 105, and private Cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI), device set 123, storage 124, and Internet of Things (IoT) sensor set 135), and network module 115. Remote server 104 includes remote database 132. Public Cloud 105 includes gateway 130, Cloud orchestration module 131, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 132. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a Cloud, even though it is not shown in a Cloud in FIG. 1. On the other hand, computer 101 is not required to be in a Cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collects and store helpful and useful data for use by other computers, such as computer 101. For example, in a hypothetical case where computer 101 is designed and programmed to provide a recommendation based on historical data, then this historical data may be provided to computer 101 from remote database 132 of remote server 104.

PUBLIC CLOUD 105 is any computer system available for use by multiple entities that provides on-demand availability of computer system resources and/or other computer capabilities, especially data storage (Cloud storage) and computing power, without direct active management by the user. Cloud computing typically leverages sharing of resources to achieve coherence and economies of scale. The direct and active management of the computing resources of public Cloud 105 is performed by the computer hardware and/or software of Cloud orchestration module 131. The computing resources provided by public Cloud 105 are typically implemented by virtual computing environments that run on various computers making up the computers of host physical machine set 142, which is the universe of physical computers in and/or available to public Cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 131 manages the transfer and storage of images, deploys new instantiations of VCEs and manages active instantiations of VCE deployments. Gateway 130 is the collection of computer software, hardware, and firmware that allows public Cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public Cloud 105, except that the computing resources are only available for use by a single enterprise. While private Cloud 106 is depicted as being in communication with WAN 102, in other embodiments a private Cloud may be disconnected from the internet entirely and only accessible through a local/private network. A hybrid Cloud is a composition of multiple Clouds of different types (for example, private, community or public Cloud types), often respectively implemented by different vendors. Each of the multiple Clouds remains a separate and discrete entity, but the larger hybrid Cloud architecture is bound together by standardized or proprietary technology that enables orchestration, management, and/or data/application portability between the multiple constituent Clouds. In this embodiment, public Cloud 105 and private Cloud 106 are both part of a larger hybrid Cloud.

One or more embodiments described herein can utilize machine learning techniques to perform prediction and or classification tasks, for example. In one or more embodiments, machine learning functionality can be implemented using an artificial neural network (ANN) having the capability to be trained to perform a function. In machine learning and cognitive science, ANNs are a family of statistical learning models inspired by the biological neural networks of animals, and in particular the brain. ANNs can be used to estimate or approximate systems and functions that depend on a large number of inputs. Convolutional neural networks (CNN) are a class of deep, feed-forward ANNs that are particularly useful at tasks such as, but not limited to analyzing visual imagery and natural language processing (NLP). Recurrent neural networks (RNN) are another class of deep, feed-forward ANNs and are particularly useful at tasks such as, but not limited to, unsegmented connected handwriting recognition and speech recognition. Other types of neural networks are also known and can be used in accordance with one or more embodiments described herein.

ANNs can be embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons that can be activated by the pixels of an input image. After being weighted and transformed by a function determined by the network's designer, the activation of these input neurons are then passed to other downstream neurons, which are often referred to as "hidden" neurons. This process is repeated until an output neuron is activated. The activated output neuron determines which character was input.

A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Figure 2A:
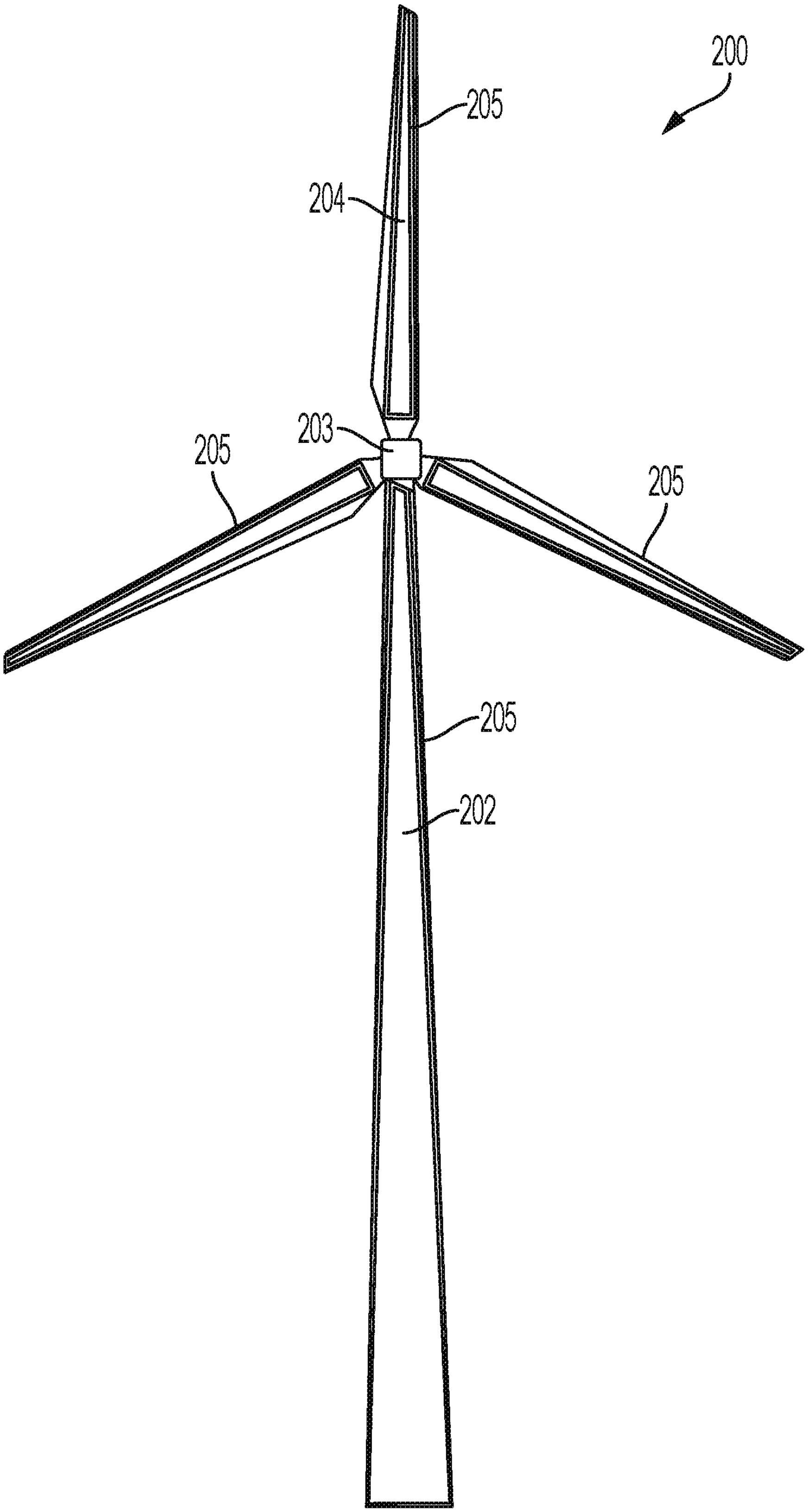
FIGS. 2A and 2B depict schematic diagrams of a wind turbine having a shadow energy generator in accordance with one or more embodiments of the present disclosure.
Figure 2B:
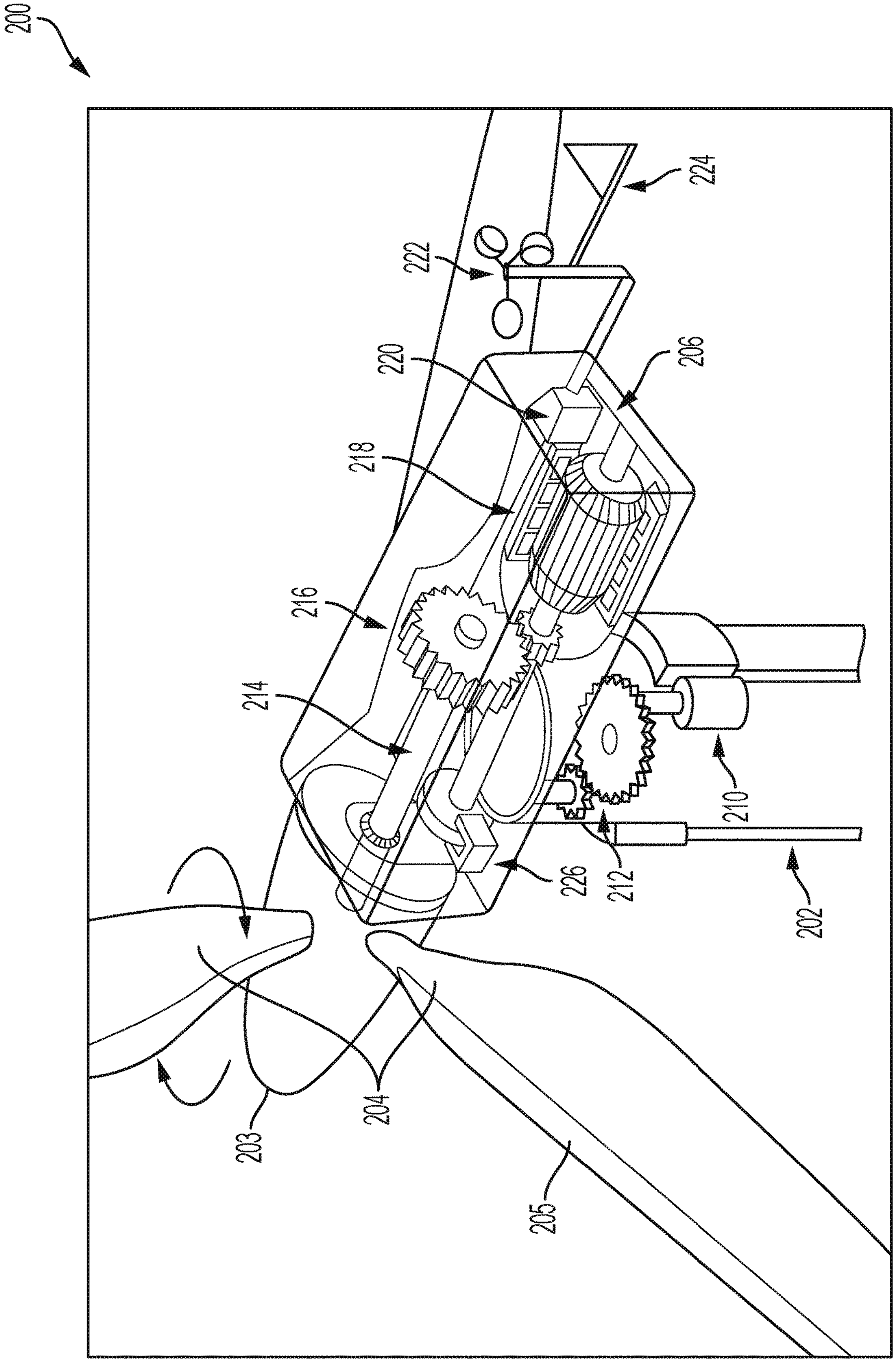

Referring now to FIGS. 2A and 2B, schematic diagrams of a wind turbine 200 having a shadow energy generator 205 in accordance with one or more embodiments of the present disclosure is shown. As illustrated, the wind turbine 200 includes a tower 202 upon which a nacelle 206 is mounted. In exemplary embodiments, the orientation of the nacelle 206 with respect to the tower 202 can be adjusted by a yaw motor 210 and yaw gears 212. The nacelle 206 is coupled to a rotor 203 by a shaft 214. The rotor 203 is connected to blades 204.

In exemplary embodiments, the blades 204 are pivotally mounted to the rotor 203 such that the blades 204 can be rotated as shown in FIG. 2B. In exemplary embodiments, a blade pitch motor (not shown) is configured to adjust the pitch of each blade 204. In exemplary embodiments, the blades 204 and the tower 202 are at least partially covered by shadow energy generator cells 205. In exemplary embodiments, a processing device 220 is configured to control the yaw motor 210 and the blade pitch motors to adjust the configuration of the wind turbine 200.

In exemplary embodiments, the shaft 214 that connects the rotor 203 to the nacelle 206 is coupled to a gear 216 that transmits rotational energy to the generator 218. In one embodiment, the wind turbine 200 may include a break 226 that is configured to limit the rotational speed of the gear 216. In one embodiment, the wind turbine 200 may include an anemometer 222 and a wind vane 224 that are configured to monitor the velocity and direction of a wind, respectively.

Figure 3:
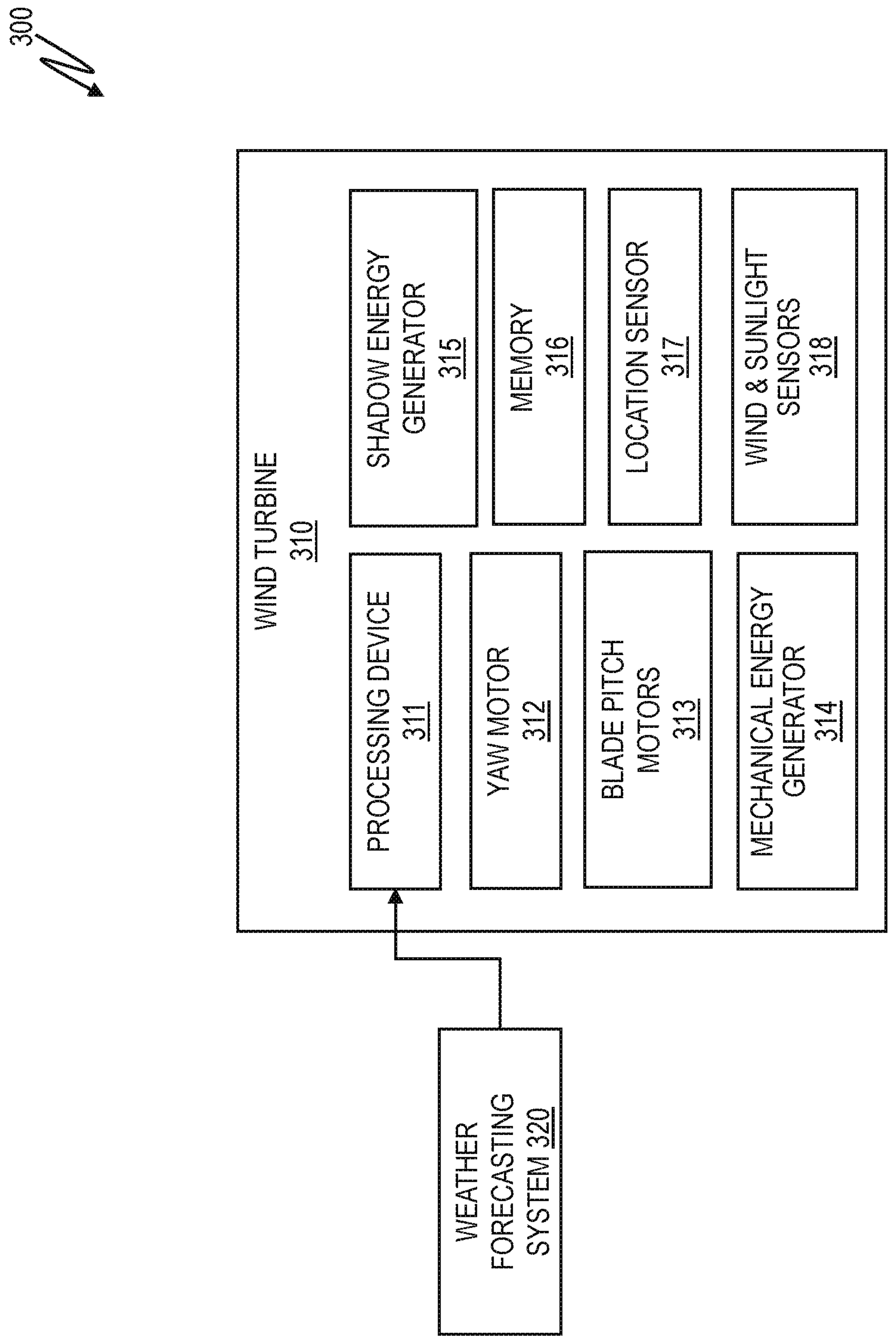
FIG. 3 depicts a block diagram of a system including a wind turbine having a shadow energy generator in accordance with one or more embodiments of the present disclosure.

Referring now to FIG. 3, a block diagram of a system 300 including a wind turbine 310 having a shadow energy generator 315 in accordance with one or more embodiments of the present disclosure is shown. As illustrated, the wind turbine 310 includes a processing device 311, a yaw motor 312, blade pitch motors 313, a mechanical energy generator 314, a shadow energy generator 315, a memory 316, a location sensor, and wind and sunlight sensors 318. In some embodiments, the wind turbine 310 may contain a subset of the components shown in FIG. 3 and in some embodiments the wind turbine 310 may contain additional components that are not shown in FIG. 3.

In exemplary embodiments, the processing device 311 of the wind turbine 310 is configured to obtain a weather forecast for the geographic location of the wind turbine 310 from a weather forecasting system 320. In various embodiments, the processing device 311 may obtain the geographic location of the wind turbine 310 from one of the location sensor 317 (such as a GPS sensor) or a memory 316. In one embodiment, the processing device 311 is configured to periodically request a weather forecast from the weather forecasting system 320 based on the geographic location of the wind turbine 310.

In exemplary embodiments, the yaw motor 312 is controlled by the processing device 311 and is configured to control the relative position of the nacelle and tower of the wind turbine 310. The blade pitch motors 313 are controlled by the processing device 311 and are configured to control the relative position of the blades and rotor of the wind turbine 310. In exemplary embodiments, the processing device 311 is configured to control the configuration of the wind turbine 310 (i.e., the relative position of the nacelle and tower and the relative position of blades and rotor) to maximize the combined energy generation of the mechanical energy generator 314 and the shadow energy generator 315 of the wind turbine 310. In one embodiment, the mechanical energy generator 314 is configured to convert the mechanical energy created by the rotation of the rotor into electrical energy, and the shadow energy generator 315 is configured to convert solar energy into electrical energy.

In exemplary embodiments, as weather conditions and the position of the sun change, the processing device 311 changes the configuration of the wind turbine via the yaw motor 312 and the blade pitch motors 313 to maximize the total energy production of the wind turbine. In exemplary embodiments, maximizing the energy production of the shadow energy generator is achieved when a shadow-to-light ratio is 50:50. Accordingly, the processing device 311 utilizes the blade pitch motors 313 to adjust the blade pitch of the blades to optimize the shadow contrast ratio. In exemplary embodiments, the processing device 311 determines the blade pitch based on the trade-off between power extracted from wind (i.e., the mechanical energy generator) and the shadow-to-light contrast ratio (i.e., the shadow energy generator).

Figure 4:
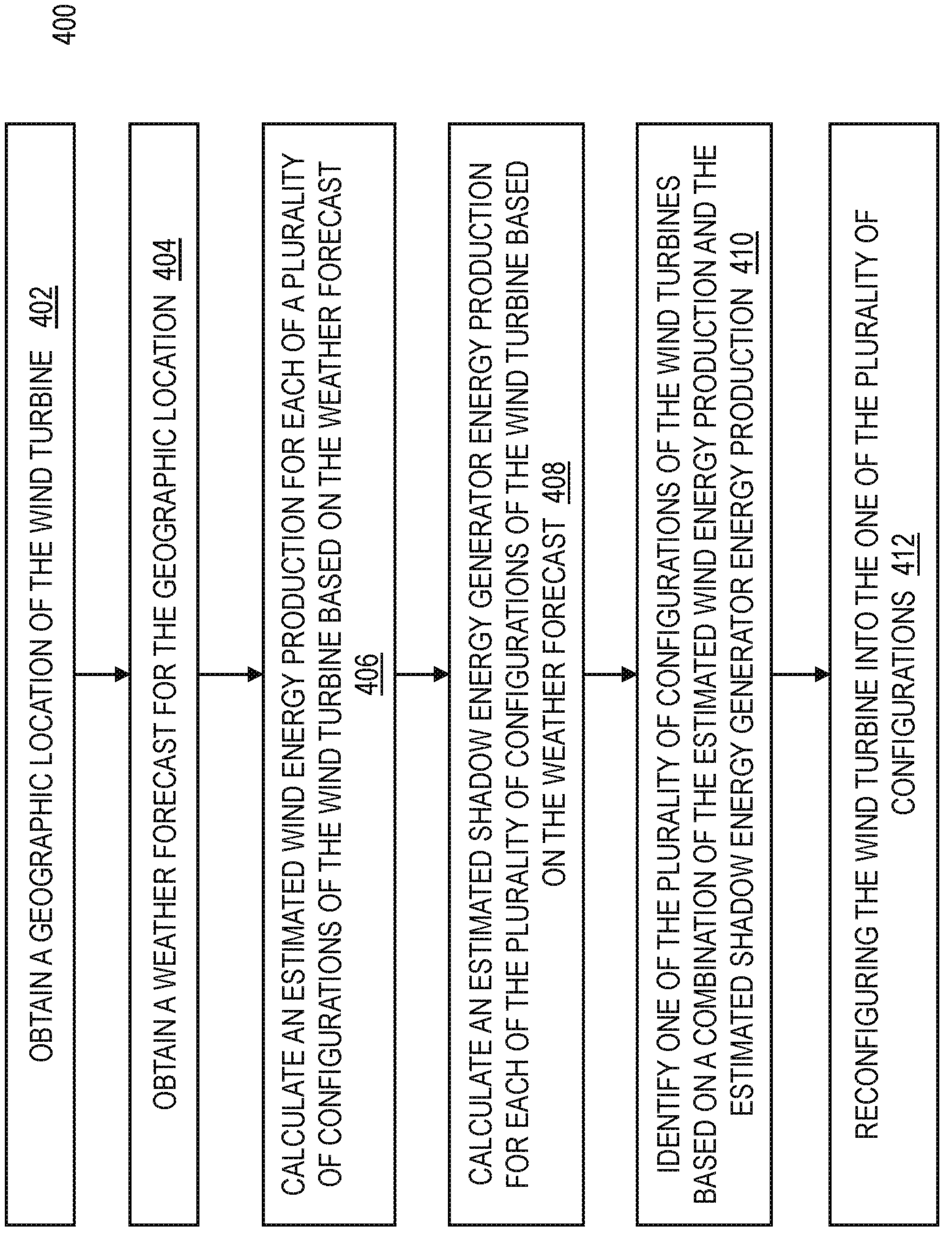
FIG. 4 depicts a flowchart of a method for optimizing energy production by a wind turbine having a shadow energy generator in accordance with one or more embodiments of the present disclosure.

Referring now to FIG. 4, a flowchart of a method for optimizing energy production by a wind turbine having a shadow energy generator in accordance with one or more embodiments of the present disclosure is shown. In one embodiment, the processing device 311 shown in FIG. 3 is configured to perform the method 400. At block 402, the method 400 includes obtaining a geographic location of the wind turbine. In one embodiment, the geographic location is obtained via a location sensor disposed in the wind turbine. In another embodiment, the geographic location is obtained from a memory of the wind turbine, e.g., the geographic location of the wind turbine is determined when the wind turbine is constructed, and the geographic location is stored in a local memory.

As shown at block 404, the method 400 includes obtaining a weather forecast for the geographic location. In exemplary embodiments, the weather forecast includes a predicted wind direction, a predicted wind velocity, and a predicted amount of sunlight for the geographic location. In one embodiment, the weather forecast includes predicted weather conditions for a fixed time period, such as one day, that includes multiple time intervals within the time period. For example, the weather forecast can include predicted weather conditions for each fifteen-minute interval for a twenty-four-hour period.

As shown at block 406, the method 400 includes calculating an estimated wind energy production for each of a plurality of configurations of the wind turbine based on the weather forecast. In exemplary embodiments, the plurality of configurations includes each configuration that the wind turbine is capable of being configured into. In exemplary embodiments, each configuration includes a yaw angle and blade pitch, where the yaw angle is the orientation of the nacelle relative to the tower of the wind turbine and where the blade pitch is the angular position of the blade relative to the rotor.

As shown at block 408, the method 400 includes calculating an estimated shadow energy generator energy production for each of the plurality of configurations of the wind turbine based on the weather forecast. In exemplary embodiments, each of the blades of the wind turbine includes a shadow energy generator disposed on at least a portion of each of the plurality of blades. In exemplary embodiments, the tower of the wind turbine includes a shadow energy generator disposed on at least a portion of the tower. In exemplary embodiments, the shadow energy generator is a solar panel having a layer of one of gold, aluminum, tungsten, and copper disposed on a layer of silicon. The estimated shadow energy generator energy production is calculated based on the expected energy production of the shadow energy generators disposed on the blades and the tower. In exemplary embodiments, the estimated shadow energy generator energy production for each of the plurality of configurations of the wind turbine is further based on the geographic location and a date and time corresponding to the weather forecast.

As shown at block 410, the method 400 includes identifying one of the plurality of configurations of the wind turbines based on a combination of the estimated wind energy production and the estimated shadow energy generator energy production. In one embodiment, the one of the plurality of configurations of the wind turbines is identified as a configuration with the largest sum of the estimated wind energy production and the estimated shadow energy generator energy production.

In one embodiment, the current configuration of the plurality of configurations of the wind turbine is identified and an energy cost to transition the wind turbine from the current configuration to each of the plurality of configurations of the wind turbine is calculated. In this embodiment, the one of the plurality of configurations of the wind turbines is identified as the configuration with a highest value calculated by adding the estimated wind energy production and the estimated shadow energy generator energy production and subtracting the energy cost to transition the wind turbine from the configuration.

As shown at block 412, the method 400 includes reconfiguring the wind turbine into the one of the plurality of configurations. In exemplary embodiments, the energy production level of the current configuration of the wind turbine is periodically compared with the estimated energy production level of the plurality of configurations of the wind turbine. For example, the wind turbine may be configured to perform this comparison every fifteen or thirty minutes. Based on a determination that another configuration of the wind turbine would produce more energy than the current configuration by at least the amount of energy required to perform the adjustment of the configuration, the wind turbine is reconfigured into the optimal configuration.

In one embodiment, the following equation can be used to calculate the estimated energy gain (J) for modifying a configuration of a wind turbine:

$$J = \text{Max} \cdot \sum_{j=1}^{N} u_j \{w_{wind} \cdot E_{wind}(\beta_i^r) + w_{SEG} \cdot E_{SEG}(\beta_i^r)\} - \sum_{i=1}^{N} w_{u\delta_i} (\Delta u)^2$$

where $E_{SEG}$ is the energy production from the shadow energy generator as a function of contrast ratio 'L' which in turn is a function of blade angle 'β', $E_{wind}$ is the energy production of wind turbine is a function of blade angle 'β', $w_{wind}$, $w_{SEG}$ are weighing coefficient for energy generated from wind turbine and embedded shadow energy generator, respectively, (Δu) is a controller variable for blade angle control, and $\beta^{max}$ is a maximum limit for wind turbine blade angle.

In one embodiment, a wind turbine includes blades that are 40-90 meters (m) in length and 3-5 m in width. With blades that are 70 m long and 4 m wide, the surface area of one side of a blade is 280 $m^2$ and the total surface area of a blade is 560 $m^2$. For three blades, the total surface area is 1680 $m^2$. For a tower height of 160 m with a radius of approximately 3 m, the surface area of the tower is about 3015 $m^2$. Accordingly, the total surface area of the wind turbine is about 4700 $m^2$. For a shadow energy generator with a power density of 1.4 Watts (W) per $m^2$, the potential power generation from a shadow energy generator is approximately 6.57 kW. For a typical sunny day, the additional generation from the shadow energy generator would be about 52.8 kWh/day (8 (hrs.)×6.57=52.8). On average a 600 kW wind turbine power generation produces approximately 1370 k Wh/day. Accordingly, by incorporating a shadow energy generator into the wind turbine, the energy produced by the wind turbine will increase by about 4%.

Various embodiments are described herein with reference to the related drawings. Alternative embodiments can be devised without departing from the scope of the present disclosure. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the present disclosure may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for optimizing energy production by a wind turbine having shadow energy generator, the method comprising:

obtaining a geographic location of the wind turbine;

obtaining a weather forecast for the geographic location;

calculating an estimated wind energy production for each of a plurality of configurations of the wind turbine based on the weather forecast;

calculating an estimated shadow energy generator energy production for each of the plurality of configurations of the wind turbine based on the weather forecast;

identifying one of the plurality of configurations of the wind turbines based on a combination of the estimated wind energy production and the estimated shadow energy generator energy production;

reconfiguring the wind turbine into the one of the plurality of configurations;

identifying a current configuration of the plurality of configurations of the wind turbine;

calculating an energy cost to transition the wind turbine from the current configuration to each of the plurality of configurations of the wind turbine, wherein the one of the plurality of configurations of the wind turbine is identified as the configuration with a highest value calculated by adding the estimated wind energy production and the estimated shadow energy generator energy production and subtracting the energy cost to transition the wind turbine from the configuration.

2. The method of claim 1, wherein the wind turbine includes a plurality of blades and wherein the shadow energy generator is disposed on at least a portion of each of the plurality of blades.

3. The method of claim 2, wherein each of the plurality of configurations of the wind turbine includes a blade pitch for each of the plurality of blades.

4. The method of claim 1, wherein the wind turbine includes a tower and wherein the shadow energy generator is disposed on at least a portion of the tower.

5. The method of claim 1, wherein the shadow energy generator is a solar panel having a layer of one of gold, aluminum, tungsten, and copper disposed on a layer of silicon.

6. The method of claim 1, wherein the weather forecast includes a predicted wind direction, a predicted wind velocity, and predicted amount of sunlight.

7. The method of claim 1, wherein the estimated shadow energy generator energy production for each of the plurality of configurations of the wind turbine is further based on the geographic location and a date and time corresponding to the weather forecast.

8. A wind turbine having shadow energy generator, the wind turbine having a memory having computer readable instructions and a processing device for executing the computer readable instructions, the computer readable instructions controlling the processing device to perform operations that include obtaining a geographic location of the wind turbine;

obtaining a weather forecast for the geographic location;

calculating an estimated wind energy production for each of a plurality of configurations of the wind turbine based on the weather forecast;

calculating an estimated shadow energy generator energy production for each of the plurality of configurations of the wind turbine based on the weather forecast;

identifying one of the plurality of configurations of the wind turbine based on a combination of the estimated wind energy production and the estimated shadow energy generator energy production;

reconfiguring the wind turbine into the one of the plurality of configurations;

identifying a current configuration of the plurality of configurations of the wind turbine; and calculating an energy cost to transition the wind turbine from the current configuration to each of the plurality of configurations of the wind turbine, wherein the one of the plurality of configurations of the wind turbine is identified as the configuration with a highest value calculated by adding the estimated wind energy production and the estimated shadow energy generator energy production and subtracting the energy cost to transition the wind turbine from the configuration.

9. The wind turbine of claim 8, wherein the wind turbine includes a plurality of blades and wherein the shadow energy generator is disposed on at least a portion of each of the plurality of blades.

10. The wind turbine of claim 9, wherein each of the plurality of configurations of the wind turbine includes a blade pitch for each of the plurality of blades.

11. The wind turbine of claim 8, wherein the wind turbine includes a tower and wherein the shadow energy generator is disposed on at least a portion of the tower.

12. The wind turbine of claim 8, wherein the shadow energy generator is a solar panel having a layer of one of gold, aluminum, tungsten, and copper disposed on a layer of silicon.

13. The wind turbine of claim 8, wherein the weather forecast includes a predicted wind direction, a predicted wind velocity, and predicted amount of sunlight.

14. The wind turbine of claim 8, wherein the estimated shadow energy generator energy production for each of the plurality of configurations of the wind turbine is further based on the geographic location and a date and time corresponding to the weather forecast.

15. A computer program product comprising a computer readable storage medium having program instructions embodied therewith, the program instructions executable by a processor to cause the processor to perform operations comprising:

obtaining a geographic location of a wind turbine;

obtaining a weather forecast for the geographic location;

calculating an estimated wind energy production for each of a plurality of configurations of the wind turbine based on the weather forecast;

calculating an estimated shadow energy generator energy production for each of the plurality of configurations of the wind turbine based on the weather forecast;

identifying one of the plurality of configurations of the wind turbine based on a combination of the estimated wind energy production and the estimated shadow energy generator energy production;

reconfiguring the wind turbine into the one of the plurality of configurations;

identifying a current configuration of the plurality of configurations of the wind turbine; and calculating an energy cost to transition the wind turbine from the current configuration to each of the plurality of configurations of the wind turbine, wherein the one of the plurality of configurations of the wind turbine is identified as the configuration with a highest value calculated by adding the estimated wind energy production and the estimated shadow energy generator energy production and subtracting the energy cost to transition the wind turbine from the configuration.

16. The computer program product of claim 15, wherein the wind turbine includes a plurality of blades and wherein the shadow energy generator is disposed on at least a portion of each of the plurality of blades.

17. The computer program product of claim 16, wherein each of the plurality of configurations of the wind turbine includes a blade pitch for each of the plurality of blades.

18. The computer program product of claim 15, wherein the wind turbine includes a tower and wherein the shadow energy generator is disposed on at least a portion of the tower.

* * * * *